(12) United States Patent
Namiki et al.

(10) Patent No.: US 12,381,089 B2
(45) Date of Patent: Aug. 5, 2025

(54) INFORMATION PROCESSING SYSTEM, INFORMATION PROCESSING METHOD, PROGRAM, AND SUBSTRATE PROCESSING APPARATUS

(71) Applicant: EBARA CORPORATION, Tokyo (JP)

(72) Inventors: Keisuke Namiki, Tokyo (JP); Makoto Fukushima, Tokyo (JP); Osamu Nabeya, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 902 days.

(21) Appl. No.: 17/425,195

(22) PCT Filed: Dec. 4, 2019

(86) PCT No.: PCT/JP2019/047317
§ 371 (c)(1),
(2) Date: Jul. 22, 2021

(87) PCT Pub. No.: WO2020/153001
PCT Pub. Date: Jul. 30, 2020

(65) Prior Publication Data
US 2022/0093409 A1    Mar. 24, 2022

(30) Foreign Application Priority Data

Jan. 24, 2019 (JP) ................. 2019-010209

(51) Int. Cl.
*H01L 21/306* (2006.01)
*B24B 37/005* (2012.01)
(Continued)

(52) U.S. Cl.
CPC ...... *H01L 21/30625* (2013.01); *B24B 37/005* (2013.01); *G06F 17/15* (2013.01); *G06N 3/08* (2013.01); *G06N 20/00* (2019.01)

(58) Field of Classification Search
CPC ............ H01L 21/30625; H01L 21/304; B24B 37/005; G06F 17/15; G06N 3/08; G06N 20/00; G06N 20/20
See application file for complete search history.

(56) References Cited

U.S. PATENT DOCUMENTS

| 5,664,066 A | 9/1997 | Sun et al. |
| 6,439,964 B1 | 8/2002 | Prahbu et al. |

(Continued)

FOREIGN PATENT DOCUMENTS

| CN | 104583712 A | 4/2015 |
| JP | 2001-160544 A | 6/2001 |

(Continued)

*Primary Examiner* — Ziaul Karim
(74) *Attorney, Agent, or Firm* — BakerHostetler

(57) ABSTRACT

A system includes a first artificial intelligence unit that predicts a performance value by using, as an input, each of a plurality of verification datasets including combinations of the parameter types that are same as the combinations of the parameter types at the time of learning; a selection unit that selects one set of parameter types from a plurality of sets of parameter types included in the plurality of verification datasets predicts performance values of a target substrate processing apparatus obtained by changing variable parameters among the parameters including the selected set of parameter types with, as an input, a fixed parameter intrinsically determined for a target substrate processing apparatus among parameters including the selected set of parameter types, and outputs a combination of parameter values yielding a performance value, among the predicted performance values, satisfying an extraction criterion.

9 Claims, 11 Drawing Sheets

(51) Int. Cl.
  *G06F 17/15* (2006.01)
  *G06N 3/08* (2023.01)
  *G06N 20/00* (2019.01)

(56) References Cited

U.S. PATENT DOCUMENTS

| | | |
|---|---|---|
| 7,001,243 B1 | 2/2006 | Yi et al. |
| 2005/0199341 A1* | 9/2005 | Delp ................. H01J 37/32 |
| | | 156/345.24 |
| 2012/0185813 A1* | 7/2012 | Kaushal ........... H01J 37/32926 |
| | | 716/112 |
| 2014/0032151 A1 | 1/2014 | Araki et al. |
| 2015/0161520 A1 | 6/2015 | Kaushal et al. |
| 2015/0226680 A1* | 8/2015 | Turovets ............... G01B 11/24 |
| | | 356/237.5 |
| 2017/0176983 A1* | 6/2017 | Tetiker ............... G05B 19/4188 |
| 2017/0193400 A1 | 7/2017 | Bhaskar et al. |
| 2017/0357159 A1* | 12/2017 | Kant ..................... G03F 7/20 |
| 2018/0182632 A1 | 6/2018 | Feng et al. |
| 2019/0240799 A1 | 8/2019 | Takeda et al. |

FOREIGN PATENT DOCUMENTS

| | | |
|---|---|---|
| JP | 2006-501684 A | 1/2006 |
| JP | 2010-272053 A | 12/2010 |
| JP | 2012-074574 A | 4/2012 |
| JP | 2014-507801 A | 3/2014 |
| JP | 2017-135365 A | 8/2017 |
| JP | 2018-117116 A | 7/2018 |
| KR | 2014-0010381 A | 1/2014 |
| TW | 200901269 A | 1/2009 |
| TW | 201246266 A1 | 11/2012 |
| TW | I553469 B | 10/2016 |
| TW | 201832872 A | 9/2018 |
| TW | I648764 B | 1/2019 |

* cited by examiner

| RECORD ID | PARAMETER | | | PERFORMANCE VALUE OF CMP APPARATUS | | | FACTOR DUE TO WHICH PERFORMANCE VALUE FAILS TO SATISFY CRITERION |
|---|---|---|---|---|---|---|---|
| | POLISHING PRESSURE | TURNTABLE ROTATION SPEED | ... | POLISHING RATE | ... | | |
| 00001 | XXX | YYY | ... | ZZZ | ... | | LIFE OF CONSUMABLE MEMBER |
| ... | ... | ... | ... | ... | ... | | ... |

FIG.8
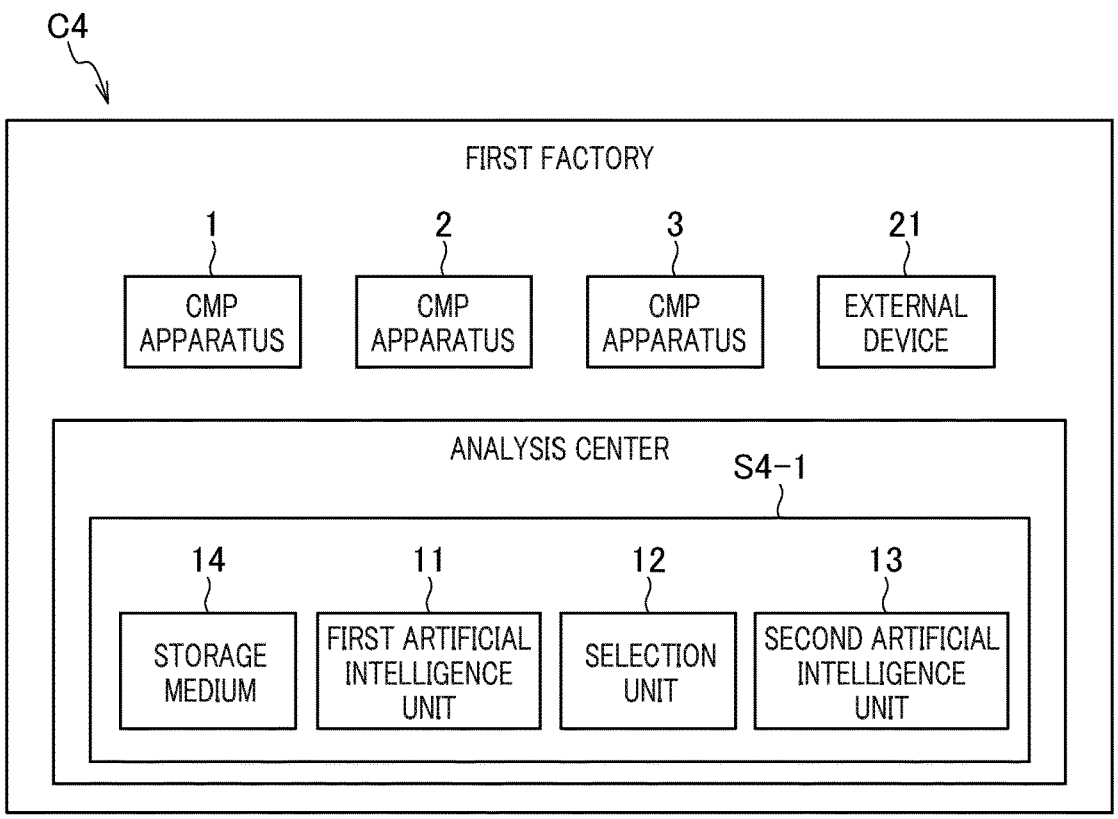
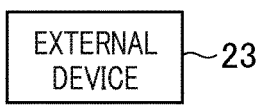
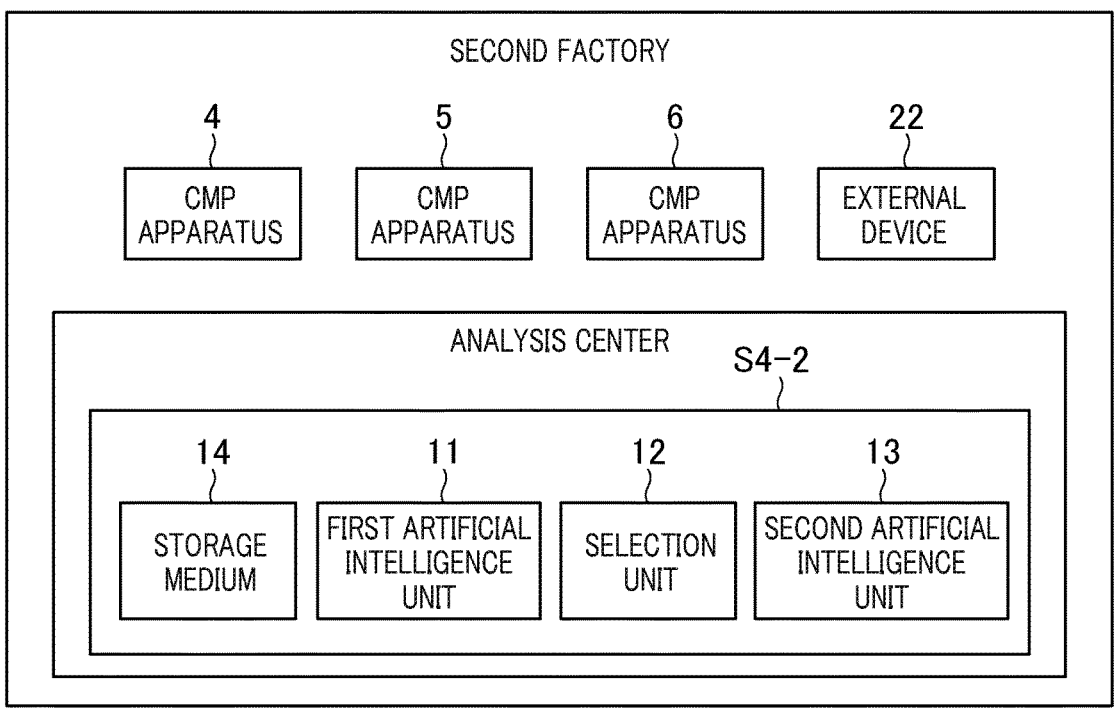

INFORMATION PROCESSING SYSTEM, INFORMATION PROCESSING METHOD, PROGRAM, AND SUBSTRATE PROCESSING APPARATUS

TECHNICAL FIELD

The present invention relates to an information processing system, an information processing method, a program, and a substrate processing apparatus.

BACKGROUND ART

In recent years, semiconductor devices have been highly integrated, making wiring of circuits finer, and a distance between wires shorter. When a semiconductor device is manufactured, a substrate processing apparatus executes various processes on a substrate (for example, a wafer). One of the ways to flatten a surface of the wafer is to use a polishing apparatus (also referred to as a chemical mechanical polishing (CMP) apparatus) that performs CMP, which is an example of a substrate processing apparatus. With the surface of the wafer flattened with the polishing apparatus, a uniform laminated structure can be formed with wide variety of materials in a film form repeatedly formed on the wafer during the manufacturing of semiconductor devices.

This type of polishing apparatus generally includes a turntable (also referred to as a polishing table) to which a polishing pad is attached, a top ring (also referred to as a polishing head) that holds a wafer, and a nozzle that supplies a polishing liquid onto the polishing pad. The wafer is polished to have its surface flattened with the top ring and the turntable relatively moving with the top ring pressing the wafer onto the polishing pad, while the polishing liquid (also referred to as slurry) is being supplied onto the polishing pad from the nozzle.

In such a polishing apparatus, when the relative pressing force between the wafer and the polishing pad during polishing is not uniform over the entire surface of the wear, insufficient polishing or overpolishing occurs depending on the pressing force applied to each portion of the wafer. In order to achieve uniform pressing force over the wafer, the polishing has been performed with the wafer pressed against the polishing pad by means of fluid pressure, via an elastic film (membrane), produced by supplying a fluid such as pressurized air into a plurality of pressure chambers provided below the top ring and formed by the elastic film.

The top ring basically includes a top ring main body that presses the wafer against the polished surface, and a retainer ring that holds an outer circumferential edge of the wafer to prevent the wafer from slipping off from the top ring. When the polishing process is performed for a long period of time, scraps of the polishing pad and slurry enter fine holes of the polishing pad to cause clogging that significantly compromises the polishing speed. Therefore, dressing of the polishing pad is performed using an apparatus called a dresser.

CITATION LIST

Patent Literature

Patent Literature 1: JP 2001-160544 A

SUMMARY OF INVENTION

Technical Problem

A typical CMP apparatus is controlled by a polishing recipe, i.e., software that follows a series of polishing processes (each process is performed using a set of pre-set parameters, such as polishing pressure, or turntable rotation speed). The setting of this set of parameters is created through trial and error, meaning that it takes time and is difficult.

In view of this, Patent Literature 1 discloses a method of determining a polishing recipe including a step of polishing a plurality of test substrates using a plurality of polishing parameter sets, a step of measuring polishing profile of each of the plurality of test substrates, and a step of calculating a polishing time for each polishing parameter set yielding a minimum difference between a predicted substrate profile and a desired substrate profile.

Still, there is a problem in that it is difficult to adjust a plurality of parameters in a substrate processing apparatus (for example, a polishing apparatus) so as to improve the performance value of the substrate processing apparatus.

The present invention has been made in view of the above problem, and an object thereof is to provide an information processing system, an information processing method, a program, and a substrate processing apparatus with which a plurality of parameters of the substrate processing apparatus can be easily adjusted to improve a performance value of the substrate processing apparatus.

Solution to Problem

An information processing system according to a first aspect of the present invention is the information processing system that provides a combination of parameter values of a substrate processing apparatus, the system comprises: a first artificial intelligence unit that performs learning using a plurality of first learning datasets input values of which are sets of parameters different from each other in a combination of parameter types and output values of which are corresponding performance values of the substrate processing apparatus, and after the learning uses, as an input, each of a plurality of verification datasets including combinations of the parameter types that are same as the combinations of the parameter types at the time of learning, to predict a performance value; a selection unit that selects one set of parameter types from a plurality of sets of parameter types included in the plurality of verification datasets, by using at least one of a value indicating a percentage of correct answer of the predicted performance value, a time required for the learning, and a time required for predicting the performance value; and a second artificial intelligence unit that performs learning using a plurality of second learning datasets an input value of which is a set of past parameter values including the selected set of parameter types and an output value of which is a corresponding past performance value, and after the learning, predicts performance values of the target substrate processing apparatus obtained by changing variable parameters among the parameters including the selected set of parameter types with, as an input, a fixed parameter intrinsically determined for a target substrate processing apparatus among parameters including the selected set of parameter types, and outputs a combination of parameter values yielding a performance value, among the predicted performance values, satisfying an extraction criterion.

With this configuration, by once selecting the parameter type using the index and then learning with the parameter of the selected parameter type, the prediction accuracy of the performance value is improved. A combination of parameter values yielding performance value predicted with improved accuracy and satisfying the extraction criterion is output, whereby a plurality of parameters of the substrate processing apparatus can be adjusted to improve the performance value of the substrate processing apparatus. In this manner, the plurality of parameters of the substrate processing apparatus can be easily adjusted to improve the performance value of the substrate processing apparatus.

An information processing system according to a second aspect of the present invention is the information processing system according to the first aspect, further comprises a determination unit that determines a correlation between each of a plurality of parameter values and performance values of the substrate processing apparatus, and uses a plurality of the determined correlations to determine parameter types of a plurality of parameters used by the first artificial intelligence unit as input values.

With this configuration, a plurality of parameters having a high level of correlation with the performance value can be selected, and the performance value can be predicted using the plurality of parameters having a high level correlation with the performance value in the second artificial intelligence unit, whereby the second artificial intelligence unit can output a combination of parameter values yielding higher performance values.

An information processing system according to a third aspect of the present invention is the information processing system according to the second aspect, wherein the determination unit determines each mutual correlation between the plurality of parameter values of the substrate processing apparatus, and uses the determined mutual correlation to add or partially or entirely replace the parameter types of the plurality of parameters used by the second artificial intelligence unit as the input values.

With this configuration, a parameter having a high level of correlation with the parameter used for learning and prediction in the second artificial intelligence unit is added or used for replacement. Thus, the performance value can be predicted using a plurality of parameters having a high level of correlation with the performance value in the second artificial intelligence unit. Therefore, the second artificial intelligence unit can output a combination of the parameter values yielding higher performance values.

An information processing system according to a forth aspect of the present invention is the information processing system according to any one of the first to third aspect, further comprises an exclusion criterion determination unit that determines a formula of correlation between one parameter value and performance value of the substrate processing apparatus and uses the formula of correlation to determine a criterion for excluding an abnormal value, wherein the selection unit selects the set of parameter types excluding a parameter satisfying the determined criterion.

With this configuration, a parameter having no correlation with the performance value is excluded from the learning target. Thus, the possibility that the second artificial intelligence unit outputs a combination of parameter values having a higher performance value can be improved. Therefore, the second artificial intelligence unit can output a combination of parameter values yielding a higher performance value.

An information processing system according to a fifth aspect of the present invention is the information processing system according to any one of the first to forth aspect, wherein the second artificial intelligence unit performs further learning with sets of a plurality of parameter value used by the target substrate processing apparatus and corresponding performance values added to the second learning datasets, or replaced with existing data included in the second learning datasets, and after the learning, predicts performance values of the substrate processing apparatus with, as an input, a plurality of verification datasets including parameters including the selected set of parameter types, and outputs a combination of parameter values yielding a performance value, among the predicted performance values, satisfying the extraction criterion.

With this configuration, there is a possibility that a combination of parameter values yielding an even higher performance value can be output.

An information processing method according to a sixth aspect of the present invention is the information processing method of providing a combination of parameter values of a substrate processing apparatus, the method comprises: performing learning using a plurality of first learning datasets input values of which are sets of parameters different from each other in a combination of parameter types and output values of which are corresponding performance values of the substrate processing apparatus, and after the learning, predicts a performance value with, as an input, each of a plurality of verification datasets including combinations of the parameter types that are common to the combinations of the parameter types at the time of learning; selecting one set of parameter types from a plurality of sets of parameter types included in the plurality of verification datasets, by using at least one of a value indicating a percentage of correct answer of the predicted performance value, a time required for the learning, and a time required for predicting the performance value; and performing learning using a plurality of second learning datasets an input value of which is a set of past parameter values including the selected set of parameter types and an output value of which is a corresponding past performance value, and after the learning, predicting performance values of the target substrate processing apparatus with, as an input, a plurality of verification datasets including parameters including the selected set of parameter types, and outputting a combination of parameter values yielding a performance value, among the predicted performance values, satisfying an extraction criterion.

With this configuration, by once selecting the parameter type using the index and then learning with the parameter of the selected parameter type, the prediction accuracy of the performance value is improved. A combination of parameter values yielding performance value predicted with improved accuracy and satisfying the extraction criterion is output, whereby a plurality of parameters of the substrate processing apparatus can be adjusted to improve the performance value of the substrate processing apparatus. In this manner, the plurality of parameters of the substrate processing apparatus can be easily adjusted to improve the performance value of the substrate processing apparatus.

A program according to a seventh aspect of the present invention is the program causing a computer used in the information processing system according to any one of the first aspect and the fifth aspect to function as a first artificial intelligence unit that performs learning using a plurality of first learning datasets input values of which are sets of parameters different from each other in a combination of parameter types and output values of which are corresponding performance values of the substrate processing apparatus, and after the learning, predicts a performance value with, as an input, each of a plurality of verification datasets including combinations of the parameter types that are common to the combinations of the parameter types at the time of learning.

With this configuration, the parameter type can be selected using at least one of a value indicating a percentage of correct answers of the predicted performance value, a time required for the learning, and a time required for the prediction of the performance value.

A program according to an eighth aspect of the present invention is the program causing a computer used in the information processing system according to any one of the first aspect and the fifth aspect to function as a second artificial intelligence unit that performs learning using a plurality of second learning datasets an input value of which is a set of past parameter values including the selected set of parameter types and an output value of which is a corresponding past performance value, and after the learning, predicts performance values of the target substrate processing apparatus obtained by changing variable parameters among the parameters including the selected set of parameter types with, as an input, a fixed parameter intrinsically determined for a target substrate processing apparatus among parameters including the selected set of parameter types, and outputs a combination of parameter values yielding a performance value, among the predicted performance values, satisfying an extraction criterion.

With this configuration, by learning with the parameter of the selected parameter type, the prediction accuracy of the performance value is improved. A combination of parameter values yielding performance value predicted with improved accuracy and satisfying the extraction criterion is output, whereby a plurality of parameters of the substrate processing apparatus can be adjusted to improve the performance value of the substrate processing apparatus. In this manner, the plurality of parameters of the substrate processing apparatus can be easily adjusted to improve the performance value of the substrate processing apparatus.

A substrate processing apparatus according to a ninth aspect of the present invention comprises a second artificial intelligence unit that has learned a relationship between a set of parameter values including a selected set of parameter types and performance values, the second artificial intelligence that predicts performance values of the substrate processing apparatus obtained by changing variable parameters among the parameters including the selected set of parameter types with as an input, a fixed parameter intrinsically determined for the substrate processing apparatus among the parameters including the selected set of parameter types, and outputting a combination of parameter values yielding a performance value, among the predicted performance values, satisfying an extraction criterion.

With this configuration, the combination of the parameter values satisfying the extraction criterion is output using the learned second artificial intelligence unit, and the substrate is processed using the combination of the parameter values, so that the performance of the substrate processing apparatus can be improved.

Advantageous Effects of Invention

BRIEF DESCRIPTION OF DRAWINGS

FIG. 2 is an example of a table stored in a storage medium according to the first embodiment.

FIG. 8 is a diagram illustrating a schematic configuration of an example of a CMP system according to a fourth embodiment.

DESCRIPTION OF EMBODIMENTS

Hereinafter, embodiments will be described with reference to the drawings. It should be noted that unnecessarily detailed description may be omitted. For example, a detailed description of a well-known matter and a repeated description of substantially the same configuration may be omitted. This is to avoid unnecessary redundancy of the following description and to facilitate understanding of those skilled in the art. In the embodiments, a CMP apparatus will be described as an example of a substrate processing apparatus.

First Embodiment

Figure 1:
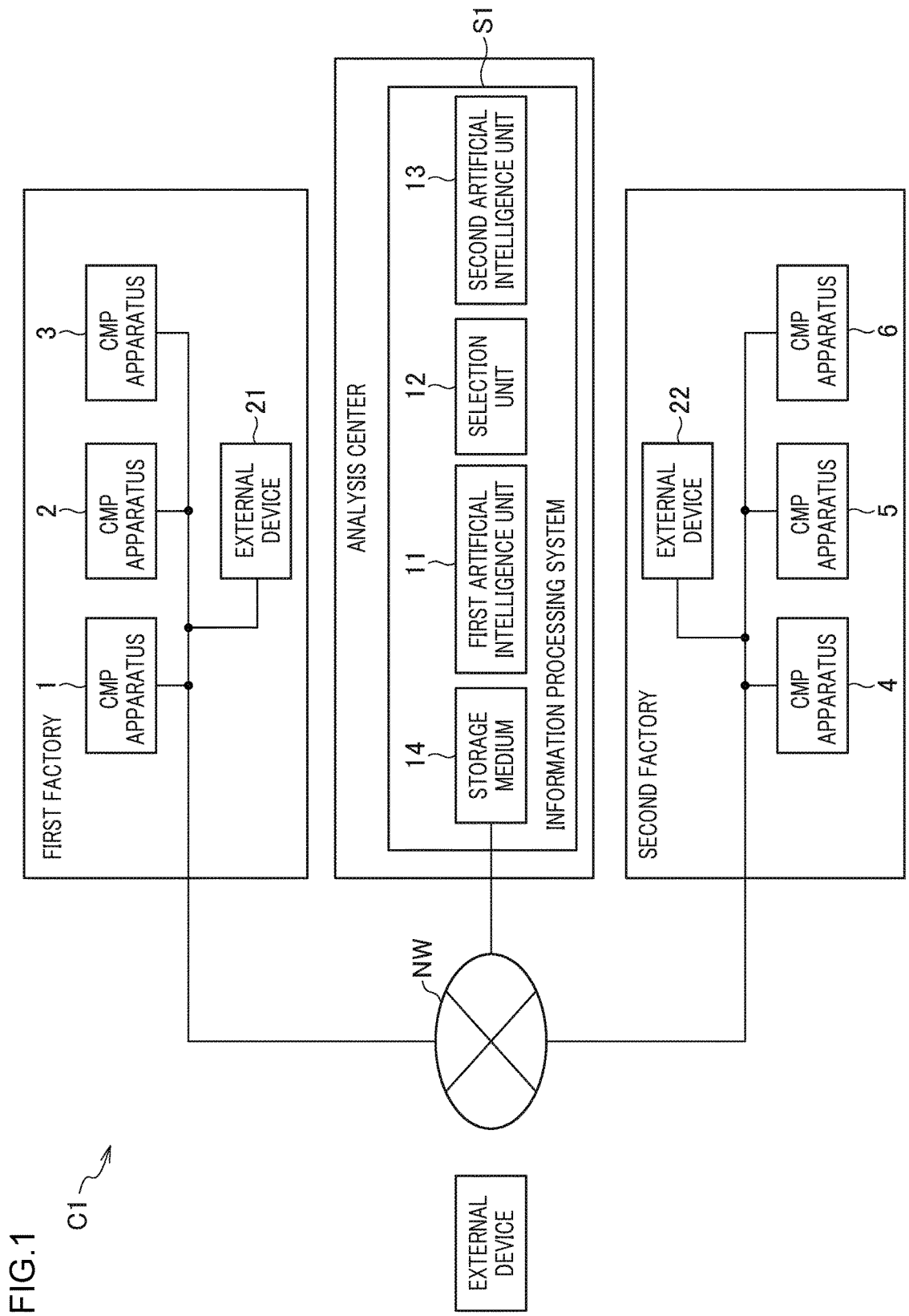
FIG. 1 is a diagram illustrating a schematic configuration of an example of a CMP system according to a first embodiment.

FIG. 1 is a diagram illustrating a schematic configuration of an example of a CMP system according to a first embodiment. As illustrated in FIG. 1, in a CMP system C1 according to the first embodiment, a first factory for semiconductor manufacturing (hereinafter, simply referred to as a first factory) is provided with CMP apparatuses 1 to 3 and an external device 21 is provided. Furthermore, in the CMP system C1 according to the first embodiment, a second factory for semiconductor manufacturing (hereinafter, simply referred to as a second factory) is provided with CMP apparatuses 4 to 6 and an external device 22. The external devices 21 and 22 in the first factory and the second factory are, for example, wafer inspection/measurement machines (such as a film thickness measuring machine, and a particle measuring machine).

In the present embodiment, in order to simplify the description, it is assumed that there are two factories and that there are three CMP apparatuses in each factory as an example. However, the present invention is not limited to this, and there may be one or three or more factories, the numbers of CMP apparatuses in the factories may not necessarily be the same, and the number of CMP apparatuses in each factory may be two or less or four or more.

In the CMP system C1 according to the first embodiment, an external device 23 is provided outside the first factory and the second factory. The external device 23 is, for example, an inspection/measurement machine of a consumable member manufacturer, a storage medium storing the inspection/measurement machine, and the like.

An analysis center is provided with an information processing system S1. The information processing system S1 includes a first artificial intelligence unit 11, a selection unit 12, a second artificial intelligence unit 13, and a storage medium 14.

FIG. 2 is an example of a table stored in a storage medium according to the first embodiment. In FIG. 2, records are accumulated that each include a set of: a record ID for identifying a record; parameters (such as, for example, polishing pressure and turntable rotation speed); a performance value (for example, the polishing rate) of the CMP apparatus operating with the set of parameters; and a factor due to which the performance value fails to satisfy a criterion. Thus, as illustrated in FIG. 2, the storage medium 14 stores a set of past parameters of each CMP apparatus and performance values of the CMP apparatus operating with this set of parameters in association with each other. In the storage medium 14, for example, a large amount of such data is stored, to be stored as what is known as big data. The storage medium 14 is, for example, a hard disk.

<Parameter>

Parameters according to the present embodiment will be described. The parameter is at least one of the following:

polishing parameter (such as, for example, the polishing pressure, the turntable rotation speed, the head rotation speed, the polishing time, and the polishing temperature);

water polishing parameter (such as, for example, polishing pressure, turntable rotation speed, head rotation speed, polishing time, pure water flow rate, and pure water temperature);

pad dress parameter (such as, for example, the dresser pressing pressure, the dresser rotation speed, the dresser swing speed, the dressing time, the turntable rotation speed, a dressing liquid flow rate, and the dresser wear degree);

cleaning parameter (such as, for example, cleaning member pressing pressure, cleaning member rotation speed, wafer rotation speed, cleaning time, cleaning liquid type, and cleaning liquid flow rate);

wafer drying parameter (such as, for example, wafer rotation speed, wafer rotational acceleration, and drying time);

wafer parameter (such as, for example, outer diameter dimension, warp, flatness, thickness, bevel shape, and polished surface roughness);

film condition (such as, for example, the film type, the initial film thickness distribution, and the surface natural oxide film layer thickness);

slurry parameter (such as, for example, the flow rate, the preload amount, the liquid film thickness distribution on the pad, the abrasive grain material, the particle size, the particle size distribution, the abrasive grain concentration, the pH, the temperature, the added chemical solution type, the added chemical solution concentration, the pH of the added chemical solution, and the added chemical solution mixing ratio);

pad parameter (such as, for example, the material, the thickness, the pad porosity, the compression elastic modulus, the compression recovery rate, the hardness, the bending strength, the surface groove shape, the thickness profile, the surface roughness, the presence or absence of surface deposits, the presence or absence of slurry residue deposition, the area of water penetration into the inside, and the number of processed wafers);

membrane parameter (such as, for example, the rubber type, the rubber hardness, the outer diameter dimension, the rubber physical property inspection data, the material lot, the production lot, and the number of processed wafers);

retainer ring parameter (such as, for example, the material type, the material physical property inspection data, the material lot, the production lot, the thickness, the groove shape/dimension, and the number of processed wafers); and hardware parameter (such as, for example, the turntable torque, the head rotation torque, the head swing torque, the dresser rotary torque, the dresser swing torque, the membrane pressure rise/fall, the membrane pressure line flow rate fluctuation, the retainer ring air-bag pressure rise/fall, the retainer ring air-bag pressure liner flow rate fluctuation).

<Performance Value of CMP Apparatus>

Next, the performance value of the CMP apparatus includes a polishing rate, within wafer uniformity (polishing rate and remaining film amount), wafer to wafer uniformity (polishing rate and remaining film amount), pattern step height elimination, or defect (such as scratches, dirt, corrosion, water marks). The watermarks are contaminants specific to the drying process, such as stains and water stains.

<Data Collection Method>

As illustrated in FIG. 1, the CMP apparatuses 1 to 6 and the storage medium 14 are connected to each other by a network NW, and the following information and data acquired by a measuring instrument or a device installed in the CMP apparatuses 1 to 6 are accumulated in the storage medium 14:

polishing parameter (polishing pressure, turntable rotation speed, head rotation speed, polishing time, and polishing temperature);

water polishing parameter (polishing pressure, turntable rotation speed, head rotation speed, polishing time, pure water flow rate, and pure water temperature);

pad dress parameter (the dresser pressing pressure, the dresser rotation speed, the dresser swing speed, the dressing time, the turntable rotation speed, a dressing liquid flow rate, and the dresser wear degree);

cleaning parameter (cleaning member pressing pressure, cleaning member rotation speed, wafer rotation speed, cleaning time, cleaning liquid type, and cleaning liquid flow rate);

wafer drying parameter (the wafer rotation speed, the wafer rotational acceleration, and the drying time);

slurry parameter (the flow rate, the preload amount, and the liquid film thickness distribution on the pad);

pad parameter (the thickness profile, the surface roughness, the presence or absence of surface deposits, the presence or absence of slurry residue deposition, the area of water penetration into the inside, and the number of processed wafers);

membrane parameter (the number of processed wafers);

retainer ring parameter (the thickness and the number of processed wafers);

hardware parameter (the turntable torque, the head rotation torque, the head swing torque, the dresser rotary torque, the dresser swing torque, the membrane pressure rise/fall, the membrane pressure line flow rate fluctuation, the retainer ring air-bag pressure rise/fall, the retainer ring air-bag pressure liner flow rate fluctuation).

As illustrated in FIG. 1, the external devices 21 and 22 (for example, measuring instruments and/or devices) outside the CMP apparatuses 1 to 6 in the first factory and the second factory are connected to the storage medium 14 via the network NW. Thus, the following information and data acquired by the external devices 21 and 22 are accumulated in the storage medium 14:

initial wafer film thickness distribution; polishing rate, within wafer uniformity (Removal, Remaining); wafer to wafer uniformity (Removal, Remaining); pattern step height elimination; defect; wafer lot information; film type; and slurry parameter (such as pH, temperature, added chemical solution type, added chemical solution concentration, added chemical solution pH, and added chemical solution mixing ratio).

Here, Removal means a thickness of the film polished, and Remain means the thickness of the film remaining after polishing.

The following information and data measured outside the factory may be collected from suppliers, and for example, an administrator of the information processing system may collectively accumulate the collected information and data in the storage medium 14. Alternatively, a terminal device (not illustrated) of the supplier and the storage medium 14 may be connected to each other via the network NW, and after acquisition of the information and data, the data may be transmitted from the terminal device of the supplier to the storage medium 14 to be accumulated in the storage medium 14.

Wafer parameter (Lot ID, S/N, outer diameter dimension, warp, flatness, thickness, bevel shape, polished surface roughness), slurry Parameter (Lot ID, S/N, abrasive grain material, particle size, particle size distribution, abrasive grain concentration), pad parameter (Lot ID, S/N, material, thickness, pad porosity, compression elastic modulus, compression recovery ratio, hardness, bending strength, surface groove shape, thickness profile, and surface roughness), membrane parameters (Lot ID, S/N, rubber type, rubber hardness, outer diameter dimension, rubber physical property inspection data, material lot, production Lot), retainer ring parameters (Lot ID, S/N, material type, material physical property inspection data, material lot, production lot, thickness, and shape and dimension of groove).

Figure 3:
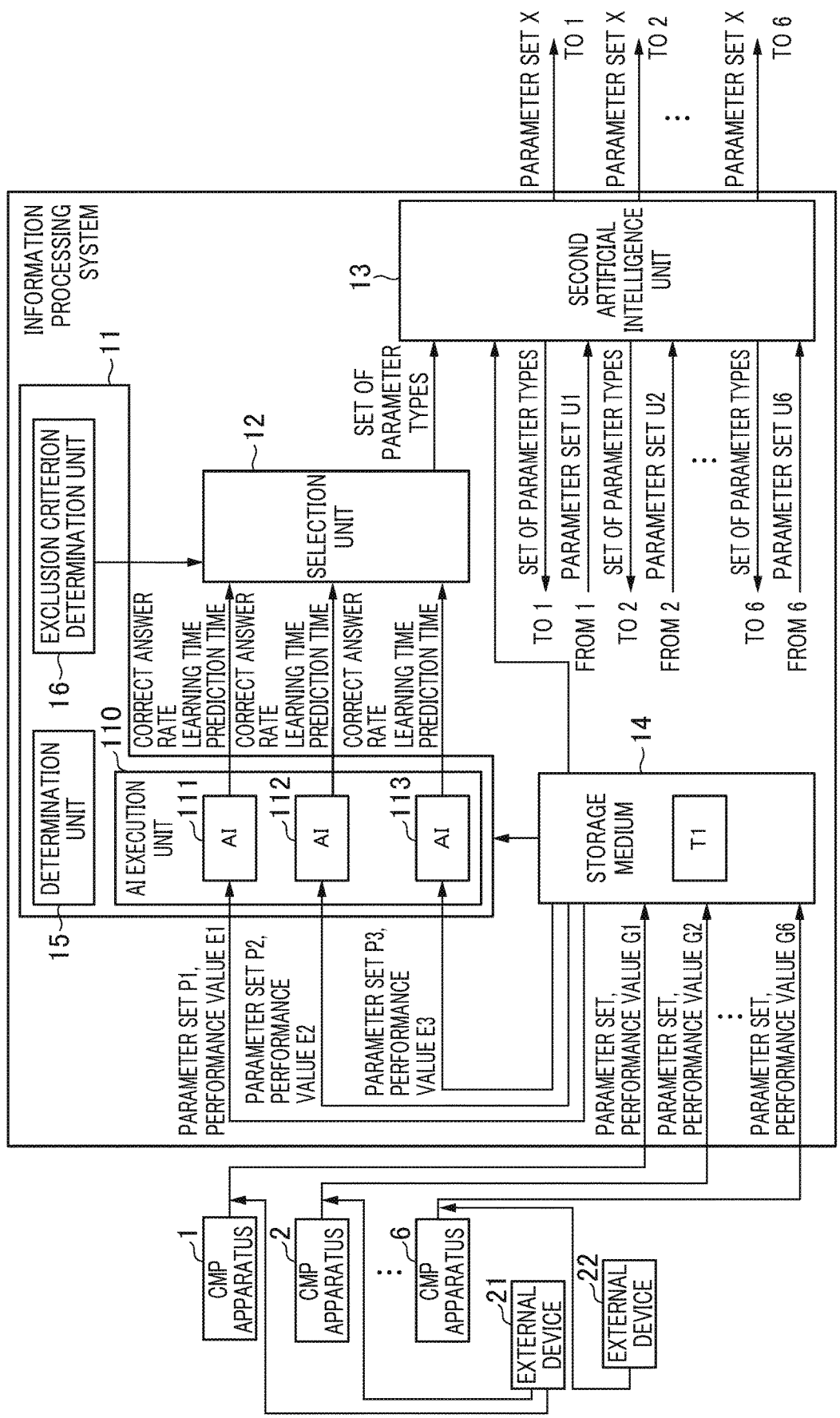
FIG. 3 is a diagram illustrating a schematic configuration of an information processing system S1 according to the first embodiment.

FIG. 3 is a diagram illustrating a schematic configuration of the information processing system S1 according to the first embodiment. As illustrated in FIG. 3, the information processing system S1 according to the first embodiment includes the first artificial intelligence unit 11, the selection unit 12, the second artificial intelligence unit 13, and the storage medium 14. As an example, the first artificial intelligence unit 11 includes an AI execution unit 110, a determination unit 15, and an exclusion criterion determination unit 16. The AI execution unit 110 includes, for example, artificial intelligences (AIs) 111, 112, and 113 executing processing in parallel. Note that the AI execution unit 110 may include only one AI and execute processing serially, may include two AIs, or may include four or more AIs. Note that the determination unit 15 and the exclusion criterion determination unit 16 may be provided outside the first artificial intelligence unit 11.

In order to perform CMP performance prediction more efficiently, the determination unit 15 performs correlation analysis between a performance value and a parameter of the CMP, correlation analysis between a parameter and another parameter, or the like on the information stored in the storage medium 14. The determination unit 15 executes, for example, a correlation analysis between the performance value and the parameter of CMP (for example, calculates a correlation coefficient), selects a plurality of types of parameters with a level of correlation (for example, a correlation coefficient) with the performance value of CMP being higher than the criterion, and outputs a set of the selected types of parameters to the first artificial intelligence unit 11. In this manner, the determination unit 15 determines the correlation between each of the plurality of parameter values of the substrate processing apparatus (the CMP apparatus in this example) and the performance value, and uses a plurality of correlations thus determined to determine the parameter types of the plurality of parameters used as the input values by the first artificial intelligence unit 11. As a result, a plurality of parameters having a high level of correlation with the performance value can be selected, and the performance value can be predicted using the plurality of parameters having a high level correlation with the performance value in the second artificial intelligence unit 13, whereby the second artificial intelligence unit 13 can output a combination of parameter values of higher performance values.

Note that, in a case where a factor of the singular point is clarified and a correlation with a new parameter is confirmed due to further accumulation of the information in the storage medium 14, the determination unit 15 may add or replace a parameter used for learning by the second artificial intelligence unit 13, and periodically update the filtering rule. In this manner, the determination unit 15 determines the correlation between the plurality of parameter values of the substrate processing apparatus (the CMP apparatus in this example), and uses the correlation therebetween thus determined to add or partially/entirely replace the parameter types of the plurality of parameters used as the input values by the second artificial intelligence unit 13.

Thus, a parameter having a high level of correlation with the parameter used for learning and prediction in the second artificial intelligence unit 13 is added or used for replacement. Thus, the performance value can be predicted using a plurality of parameters having a high level of correlation with the performance value in the second artificial intelligence unit 13. Therefore, the second artificial intelligence unit 13 can output a combination of the parameter values yielding higher performance values.

The AI execution unit 110 of the first artificial intelligence unit 11 performs learning using each of a plurality of first learning datasets input values of which are sets of parameters different from each other in the combination of the parameter types determined by the determination unit 15, and the output value of which is the corresponding performance value of the substrate processing apparatus (a CMP apparatus in this example). This learning is, for example, machine learning, and specifically, for example, supervised learning. The machine learning may be supervised learning of a neural network (for example, supervised learning of deep learning), supervised learning using a pattern recognition model (for example, supervised learning of a support vector machine), or supervised learning using a probability model (for example, supervised learning of a simple Bayesian classifier).

For example, a case is assumed where the plurality of parameter types determined by the determination unit 15 are three types of A, B, and C. A parameter set P1 is a set of a parameter of the parameter type A and a parameter of the parameter type B. A parameter set P2 is a set of a parameter of the parameter type A and a parameter of the parameter type C. A parameter set P3 is a set of a parameter of the parameter type B and a parameter of the parameter type C.

The AI 111 performs learning by using a plurality of learning datasets the input value of which is the parameter set P1 and the output value of which is a performance value E1 of the CMP apparatus obtained with the parameter set P1.

The AI 112 performs learning by using a plurality of learning datasets the input value of which is the parameter set P2 and the output value of which is a performance value E2 of the CMP apparatus obtained with the parameter set P2.

The AI 113 performs learning by using a plurality of learning datasets the input value of which is the parameter set P3 and the output value of which is a performance value E3 of the CMP apparatus obtained with the parameter set P3.

After the learning, the first artificial intelligence unit 11 predicts the performance value using each of a plurality of verification datasets with, as an input, the combination of parameter types that is the common to that at the time of the learning.

Specifically, a verification parameter set Q1 is a set of a parameter of the parameter type A and a parameter of the parameter type B. When the verification parameter set Q1 is input, the AI 111 after the learning outputs a predicted performance value. Thus, the verification parameters of the combination of parameter types that is the same as that at the time of learning are input.

Similarly, a verification parameter set Q2 is a set of a parameter of the parameter type A and a parameter of the parameter type C. When the verification parameter set Q2 is input, the AI 112 after learning outputs a predicted performance value. Thus, the verification parameters of the combination of parameter types that is the same as that at the time of learning are input.

Similarly, the verification parameter set Q3 is a combination of the parameter of the parameter type B and the parameter of the parameter type C. When the verification parameter set Q3 is input, the AI 113 after the learning outputs a predicted performance value. Thus, the verification parameters of the combination of parameter types that is the same as that at the time of learning are input.

Each of the AIs 111, 112, and 113 outputs a value (for example, a correct answer rate) indicating the percentage of correct answers of the predicted performance value, the time required for the learning (hereinafter, also referred to as learning time), and the time required for the first artificial intelligence unit 11 to predict the performance value (hereinafter, also referred to as a prediction time) to the selection unit 12.

The selection unit 12 selects one set of parameter types from among a plurality of sets of parameter types included in a plurality of verification datasets by using at least one of the value (for example, a correct answer rate) indicating the percentage of correct answers of the predicted performance value, the time required for the learning, and the time required for the first artificial intelligence unit to predict the performance value. For example, the selection unit 12 may select a set of parameter types based on a balance among the learning time, the prediction time, and the correct answer rate. Specifically, for example, the selection unit 12 may select a set of parameter types having the highest correct answer rate among those with the learning time shorter than the first reference time and the prediction time shorter than the second reference time. As a result, it is possible to select a set of parameter types having the highest correct answer rate while also having the learning time and the prediction time that fall within the allowable range.

Note that, when the correct answer rate output from the AI 111 is the highest among the correct answer rates output from the AIs 111, 112, and 113, the selection unit 12 may select a set of the parameter type A and the parameter type B.

The exclusion criterion determination unit 16 determines an abnormal value exclusion condition for excluding an abnormal value among the parameter values. Specifically, for example, the exclusion criterion determination unit 16 determines a formula of correlation between one parameter value of the substrate processing apparatus (a CMP apparatus in this example) and the performance value, and determines a criterion for eliminating an abnormal value using the correlation formula (such as, for example, excluding a point the deviation from which from the correlation formula exceeds a threshold value). Then, for example, the selection unit 12 selects a set of parameter types excluding parameters that satisfy the criterion determined by the exclusion criterion determination unit 16. With this configuration, a parameter having no correlation with the performance value is excluded from the learning target. Thus, the possibility that the second artificial intelligence unit 13 outputs a combination of parameter values yielding a higher performance value can be improved. Therefore, the second artificial intelligence unit 13 can output a combination of parameter values yielding a higher performance value.

Furthermore, the first artificial intelligence unit 11 also proposes an optimal condition for parameters other than the recipe of the CMP apparatus such as, for example, the type and combination of the consumable members to be used, the materials, and the tendency of physical properties. The information thus obtained can also be used for process development a well as development and improvement of the consumable members. A neural network or the like may be used as the algorithm in the first artificial intelligence unit 11.

<Learning of Second Artificial Intelligence Unit 13>

The second artificial intelligence unit 13 reads a past parameter set including a set of parameter types selected by the selection unit 12 and the corresponding past performance value, from the storage medium 14. Then, the second artificial intelligence unit 13 performs learning using a plurality of second learning datasets the input value of which is the set of past parameters read and the output value of which is the corresponding past performance value.

As described above, the second artificial intelligence unit 13 performs learning using learning data the input value of which is a set of past parameter values including a set of parameter types selected by the selection unit 12 and the output value of which is the corresponding past performance value. This learning is, for example, machine learning, and specifically, for example, supervised learning. The machine learning may be supervised learning of a neural network (for example, supervised learning of deep learning), supervised learning using a pattern recognition model (for example, supervised learning of a support vector machine), or supervised learning using a probability model (for example, supervised learning of a simple Bayesian classifier).

<Verification by Second Artificial Intelligence Unit 13>

After the learning, the second artificial intelligence unit 13 requests the target CMP apparatuses 1 to 6 for a fixed parameter that is intrinsically determined for each of the CMP apparatuses 1 to 6, among the parameters including the set of parameter types selected by the selection unit 12.

In response to this request, the second artificial intelligence unit 13 receives a set of fixed parameters Ui (i is an integer in a range from 1 to 6) transmitted from a CMP apparatus i (i is an integer in a range from 1 to 6).

The second artificial intelligence unit 13 predicts the performance value of each target CMP apparatus i as a result of shifting (changing) the value of the variable parameter among the parameter types selected by the selection unit 12, with a set Ui (i is an integer that is in a range from 1 to 6) of fixed parameters received used an input. Then, the second artificial intelligence unit 13 outputs a set of parameter values yielding the performance value, among the performance values predicted for the CMP apparatus i, satisfying the extraction criterion. Specifically, for example, the second artificial intelligence unit 13 outputs a set of parameter values with the best performance value among the performance values predicted for the CMP apparatus i. The second artificial intelligence unit 13 performs such a series of processes for each of the CMP apparatuses 1 to 6.

As described above, after the learning, the second artificial intelligence unit 13 predicts the performance value of the target substrate processing apparatus (the CMP apparatus in this example) with a variable parameter, among the parameters configured by the set of parameter types selected, changed with, as an input, the fixed parameter intrinsically determined in the target substrate processing apparatus (the CMP apparatus in this example) among the parameters including the set of parameter types selected by the selection unit 12. Then, the second artificial intelligence unit 13 outputs a set of parameter values yielding the performance value, among the performance values predicted, satisfying the extraction criterion.

The second artificial intelligence unit 13 outputs a combination of parameter values satisfying the extraction criterion to the corresponding CMP apparatus i (i is an integer in a range from 1 to 6) as a set of parameters Xi (i is an integer in a range from 1 to 6). The second artificial intelligence unit 13 performs such processes for each of the CMP apparatuses 1 to 6. Specifically, a set of parameters X1 is output to the CMP apparatus 1, a set of parameters X2 is output to the CMP apparatus 2, a set of parameters X3 is output to the CMP apparatus 3, a set of parameters X4 is output to the CMP apparatus 4, a set of parameters X5 is output to the CMP apparatus 5, and a set of parameters X6 is output to the CMP apparatus 6. As a result, the CMP apparatus i operates using the set of parameters Xi (i is an integer in a range from 1 to 6), so that the performance value of all the CMP apparatuses 1 to 6 can satisfy the performance criterion.

Thereafter, the second artificial intelligence unit 13 may further perform the learning with a plurality of parameter values used by the target substrate processing apparatus and the corresponding set of performance values added to the second learning dataset or replacing existing data included in the second learning dataset. As a result, there is a possibility that a combination of parameter values yielding an even higher performance value can be output.

Figure 4:
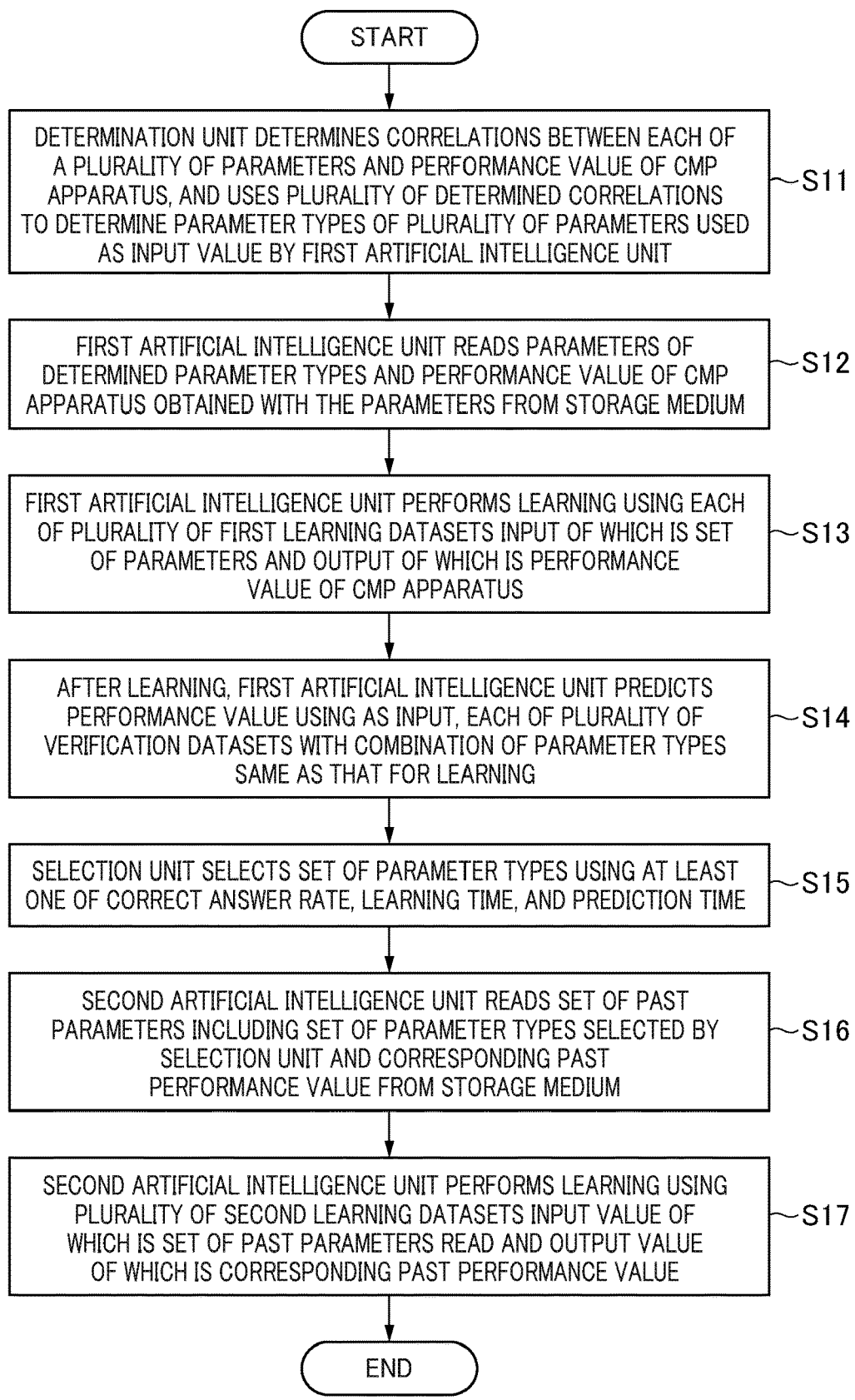
FIG. 4 is a flowchart illustrating an example of a flow of preprocessing executed by the information processing system according to the first embodiment.

Next, processing of learning and verification by the first artificial intelligence unit 11 and learning by the second artificial intelligence unit 13 will be described with reference to FIG. 4. FIG. 4 is a flowchart illustrating an example of a flow of preprocessing executed by the information processing system according to the first embodiment.

(Step S11) First of all, the determination unit 15 determines, for example, a correlation between each of a plurality of parameter values of the CMP apparatus and the performance value, and determines parameter types of a plurality of parameters to be used as input values by the first artificial intelligence unit 11, using the plurality of determined correlations. Specifically, the determination unit 15 executes, for example, a correlation analysis between the performance value of CMP and the parameter (for example, calculates a correlation coefficient), selects types of parameters with a level of correlation (for example, a correlation coefficient) with the performance value of CMP being higher than the criterion.

(Step S12) Next, the first artificial intelligence unit 11 reads, for example, the parameter of the parameter type determined in step S11 and the performance value of the CMP apparatus obtained with the parameter, from the storage medium 14.

(Step S13) Next, for example, the first artificial intelligence unit 11 performs learning with each of the plurality of first learning datasets the input values of which are the set of parameters and the output values of which are the corresponding performance values of the CMP apparatus.

(Step S14) Next, the first artificial intelligence unit 11, for example, predicts the performance value with, as an input, each of a plurality of verification datasets with a combination of parameter types being the common to that for the learning.

(Step S15) Next, the selection unit 12 uses, for example, at least one of the correct answer rate, the learning time, and the prediction time to select one set of parameter types from among the plurality of sets of parameter types included in the plurality of verification datasets.

(Step S16) Next, the second artificial intelligence unit 13 reads a past parameter set including a set of parameter types selected by the selection unit 12 and the corresponding past performance value, from the storage medium.

(Step S17) Next, the second artificial intelligence unit 13 performs learning using a plurality of second learning datasets the input value of which is the set of past parameters read and the output value of which is the corresponding past performance value. Then, the processing of this flowchart ends.

Figure 5:
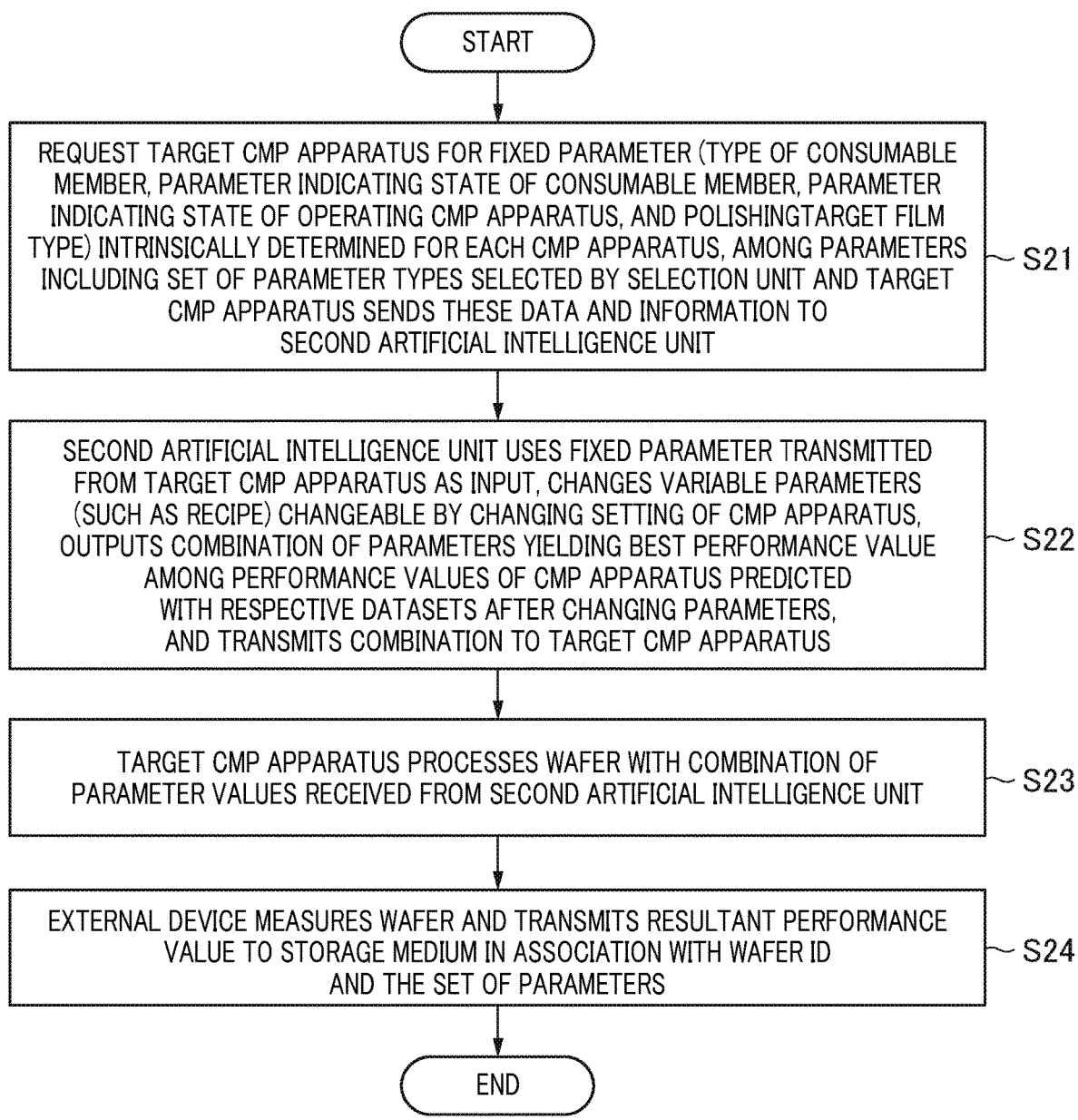
FIG. 5 is a flowchart illustrating an example of a flow of execution by the information processing system according to the first embodiment.

Next, processing executed by the second artificial intelligence unit 13 will be described with reference to FIG. 5. FIG. 5 is a flowchart illustrating an example of a flow of execution by the information processing system according to the first embodiment.

(Step S21) First of all, the second artificial intelligence unit 13 requests the target CMP apparatus for the fixed parameters intrinsically determined for each CMP apparatus among the parameters including the set of parameter types selected by the selection unit 12. Examples of such fixed parameters include: the consumable member type (such as slurry and pad type) used in the target CMP apparatus; a parameter indicating the state of the consumable member (such as physical properties, characteristics, dimensions, use time, and degree of wear); the polishing target film type; and a parameter indicating the state of the operating CMP apparatus (such as polishing temperature and rotating part torque). The target CMP apparatus sends such data and information to the second artificial intelligence unit 13.

(Step S22) Next, the second artificial intelligence unit 13 varies parameters about variable parameters (recipe, etc.) by changing the settings of the CMP apparatus etc. with, as an input, the fixed parameter sent from the target CMP apparatus, and outputs a set of parameter values yielding the best performance value among performance values of the CMP apparatus predicted with each data set after parameter variation, and sends it to the target CMP apparatus.

(Step S23) Next, the target CMP apparatus processes the wafer with the combination of the parameter values received from the second artificial intelligence unit 13.

(Step S24) The wafer is measured by the external device 21 or 22, and the obtained performance value is sent to the storage medium 14 in association with the wafer ID and the set of parameters. The storage medium 14 stores the performance value in association with the wafer ID and the set of parameters.

Then, the processing of this flowchart ends. As described above, after the second artificial intelligence unit 13 has completed the learning, first of all, among the selected set of the parameter types, the unique values of the target CMP apparatus is extracted from current information regarding of the CMP apparatus, to be input as the fixed parameter (for example, the type of the consumable member used in the CMP apparatus, the type of the film to be polished, the state quantity of the CMP apparatus in operation, and the state quantity of the consumable member) to the second artificial intelligence unit 13. Then, the variable parameters that can be changed depending on the setting of the CMP apparatus, such as recipe, are changed within a predetermined range (verification in a round-robin manner with the plurality of parameters simultaneously changed), and the values of the variable parameters yielding the best performance value are output. This is performed in an aim to optimize the variable parameters such as recipe, under the environmental parameters (fixed parameters), related to consumables and the like, different among factories and CMPs.

Alternatively, after the current information has been extracted from the CMP apparatus, various conditions may be verified with parameters to be optimized designated (usually a parameter constituting a recipe of the CMP apparatus).

<Method Performed Under Abnormality>

When the deviation between the predicted performance and the actual performance of the second artificial intelligence unit 13 is equal to or greater than the predetermined criterion, the second artificial intelligence unit 13 may request the CMP apparatus to stop the processing of the wafer. In this case, the second artificial intelligence unit 13 may request the CMP apparatus to issue a warning from the CMP apparatus, or may control the controller of the CMP apparatus to issue a warning when the CMP apparatus is requested to stop the processing of the wafer.

Regarding the parameter used for the performance prediction, when there is a certain amount of deviation between the predicted performance and the actual performance, whether there is an abnormality in an actual parameter value (also referred to as an actual value) may be determined. For example, when the slurry flow rate is used as a parameter, due to a sudden failure of the CMP apparatus or the like, the slurry flow rate received from the CMP by the second artificial intelligence unit 13 at the time of performance prediction may be deviated from the slurry flow rate at the time when the CMP apparatus actually processes the wafer. Therefore, when a warning is received from the CMP apparatus, it may be confirmed whether there is an abnormality in a parameter value, such as an actual slurry flow rate, when there is a certain amount of deviation between the predicted performance and the actual performance.

When there is an abnormality in the parameter value (actual value) when the wafer is abnormally processed, there is a possibility that the prediction accuracy of the second artificial intelligence unit 13 has been compromised due to the abnormal value being learned in the immediately preceding learning. Thus, the first artificial intelligence unit 11 changes the criterion (changes the filtering condition) for excluding the abnormal value (for example, the threshold for detecting the abnormal value), and checks the deviation between the actual performance and predicted performances obtained by the learning with the criterion thus changed. Then, the first artificial intelligence unit 11 may determine a new criterion for excluding the abnormal value, and update the abnormal value exclusion condition in the exclusion criterion determination unit 16.

Second Embodiment

Figure 6:
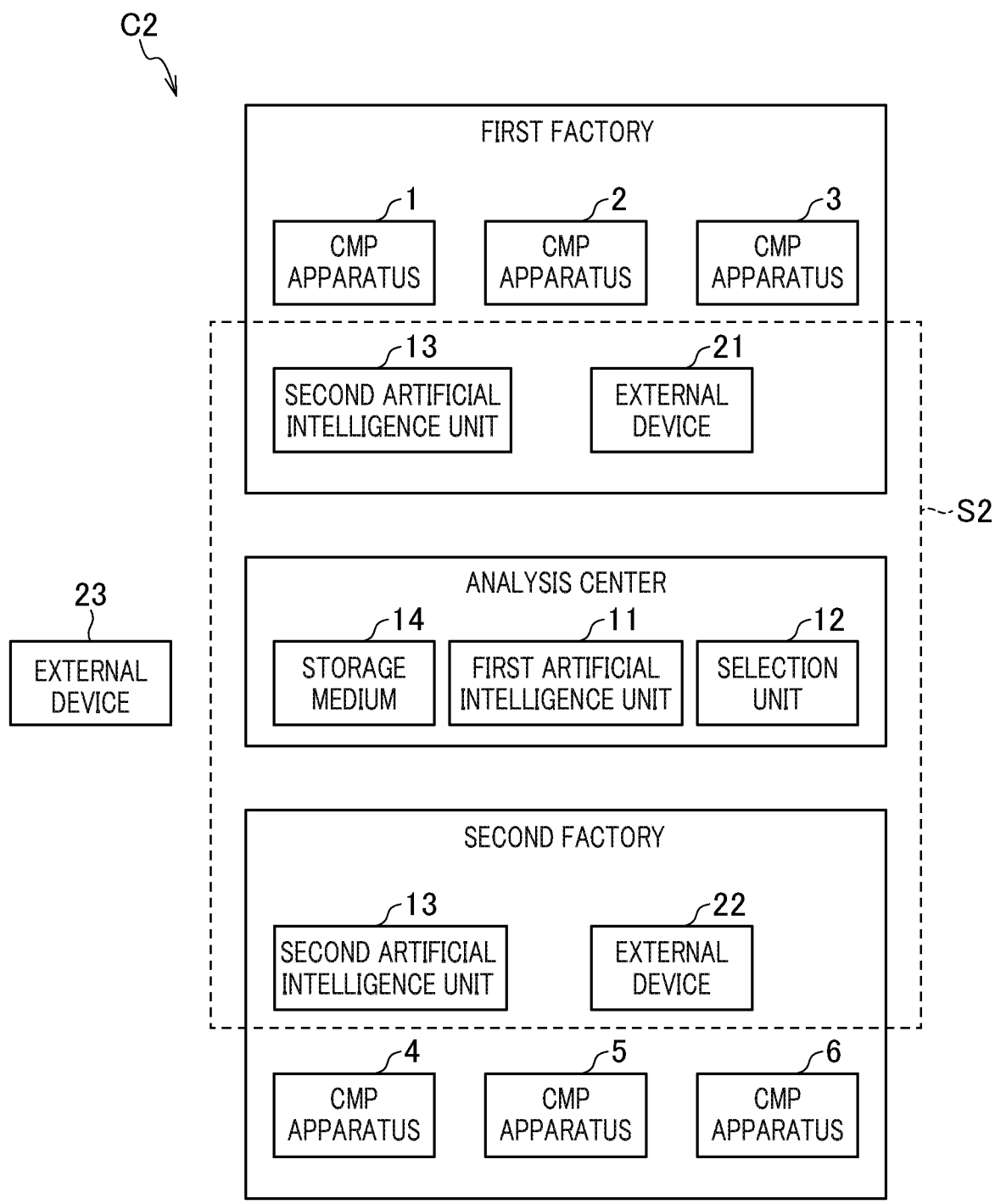
FIG. 6 is a diagram illustrating a schematic configuration of an example of a CMP system according to a second embodiment.

Next, a second embodiment will be described. FIG. 6 is a diagram illustrating a schematic configuration of an example of a CMP system according to the second embodiment. In the CMP system C1 of the first embodiment, as illustrated in FIG. 1, the first artificial intelligence unit 11, the selection unit 12, the second artificial intelligence unit 13, and the storage medium 14 are all provided in the analysis center. On the other hand, in the CMP system C2 of the second embodiment, as illustrated in FIG. 6, the first artificial intelligence unit 11, the selection unit 12, and the storage medium 14 are provided in the analysis center, but the second artificial intelligence unit 13 is provided in each of the first factory and the second factory. As illustrated in FIG. 6, the information processing system according to the second embodiment includes the first artificial intelligence unit 11, the selection unit 12, the storage medium 14, and two second artificial intelligence units 13.

Third Embodiment

Figure 7:
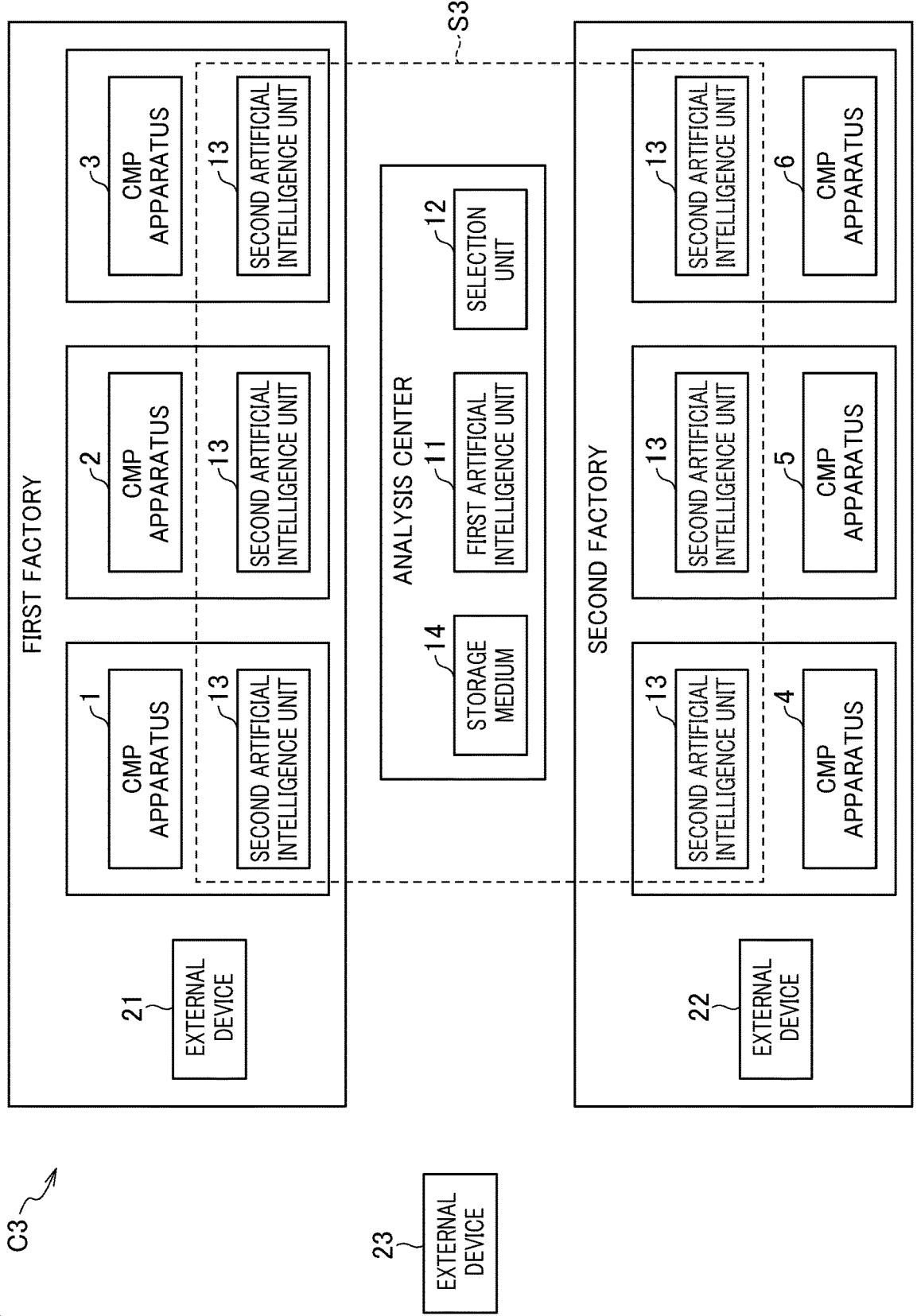
FIG. 7 is a diagram illustrating a schematic configuration of an example of a CMP system according to a third embodiment.

Next, a third embodiment will be described. FIG. 7 is a diagram illustrating a schematic configuration of an example of a CMP system according to the third embodiment. In the CMP system C1 of the first embodiment, as illustrated in FIG. 1, the first artificial intelligence unit 11, the selection unit 12, the second artificial intelligence unit 13, and the storage medium 14 are all provided in the analysis center. On the other hand, in the CMP system C3 of the third embodiment, as illustrated in FIG. 7, the first artificial intelligence unit 11, the selection unit 12, and the storage medium 14 are provided in the analysis center, but the second artificial intelligence unit 13 is provided in each of the CMP apparatuses 1 to 6. As illustrated in FIG. 7, an information processing system S3 according to the third embodiment includes the first artificial intelligence unit 11, the selection unit 12, the storage medium 14, and six second artificial intelligence units 13.

Fourth Embodiment

Next, a fourth embodiment will be described. FIG. 8 is a schematic configuration diagram of an example of a CMP system according to the fourth embodiment. In the CMP system C1 of the first embodiment, as illustrated in FIG. 1, the first artificial intelligence unit 11, the selection unit 12, the second artificial intelligence unit 13, and the storage medium 14 are all provided in the analysis center. On the other hand, in a CMP system C4 of the fourth embodiment, as illustrated in FIG. 8, each factory is provided with the analysis center including the first artificial intelligence unit 11, the selection unit 12, the second artificial intelligence unit 13, and the storage medium 14. As illustrated in FIG. 8, each of information processing systems S4-1 and S4-2 according to the fourth embodiment includes the first artificial intelligence unit 11, the selection unit 12, the second artificial intelligence unit 13, and the storage medium 14.

Fifth Embodiment

Figure 9:
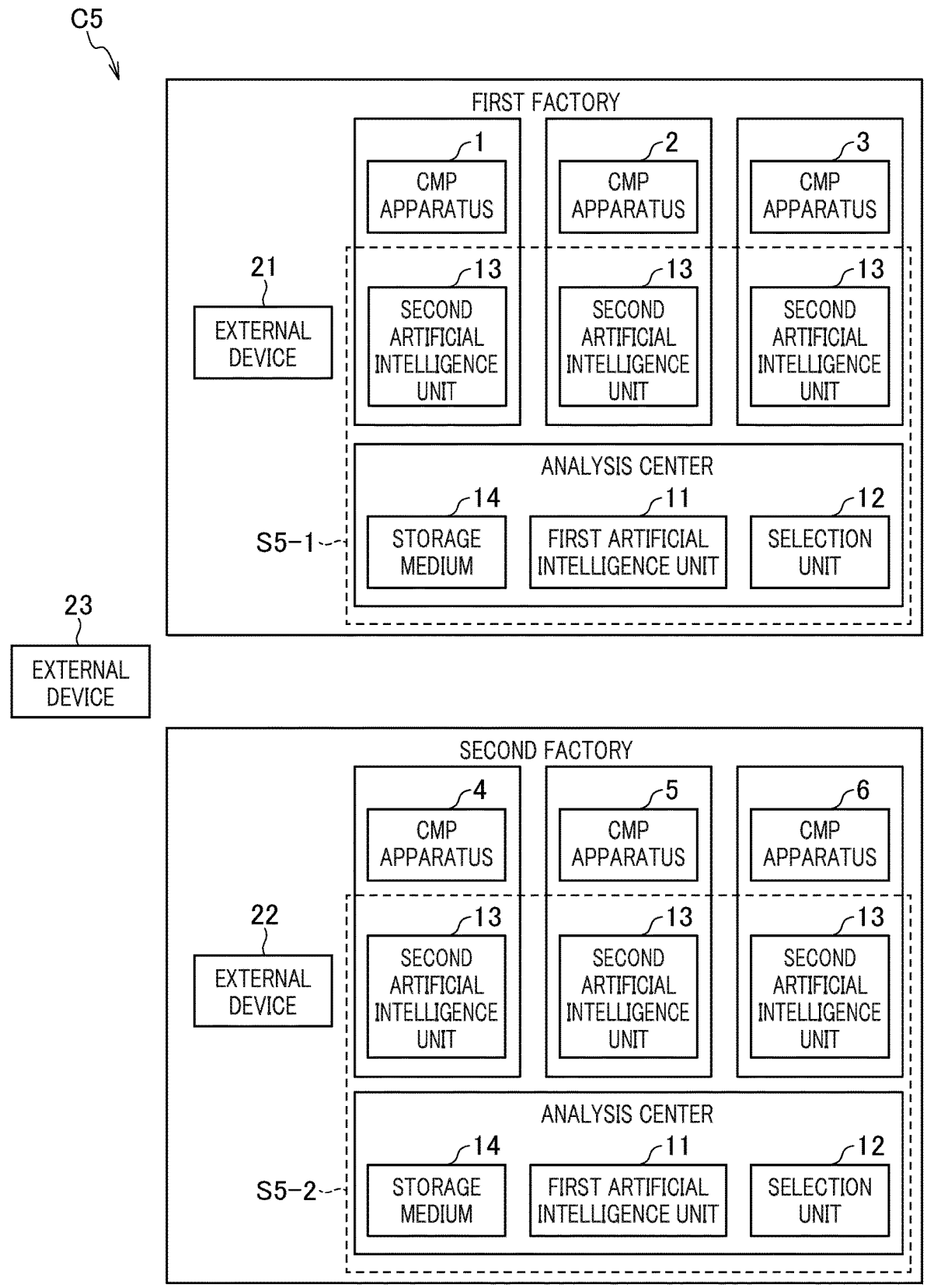
FIG. 9 is a diagram illustrating a schematic configuration of an example of a CMP system according to a fifth embodiment.

Next, a fifth embodiment will be described. FIG. 9 is a diagram illustrating a schematic configuration of an example of a CMP system according to the fifth embodiment. In the CMP system C1 of the first embodiment, as illustrated in FIG. 1, the first artificial intelligence unit 11, the selection unit 12, the second artificial intelligence unit 13, and the storage medium 14 are all provided in the analysis center. On the other hand, in a CMP system C5 of the fifth embodiment, as illustrated in FIG. 9, each factory is provided with an analysis center including the first artificial intelligence unit 11, the selection unit 12, and the storage medium 14, and the second artificial intelligence unit 13 is provided for each of the CMP apparatuses 1 to 6. As illustrated in FIG. 9, each of information processing systems S5-1 and S5-2 according to the fifth embodiment includes the first artificial intelligence unit 11, the selection unit 12, three second artificial intelligence units 13, and the storage medium 14.

Sixth Embodiment

Figure 10:
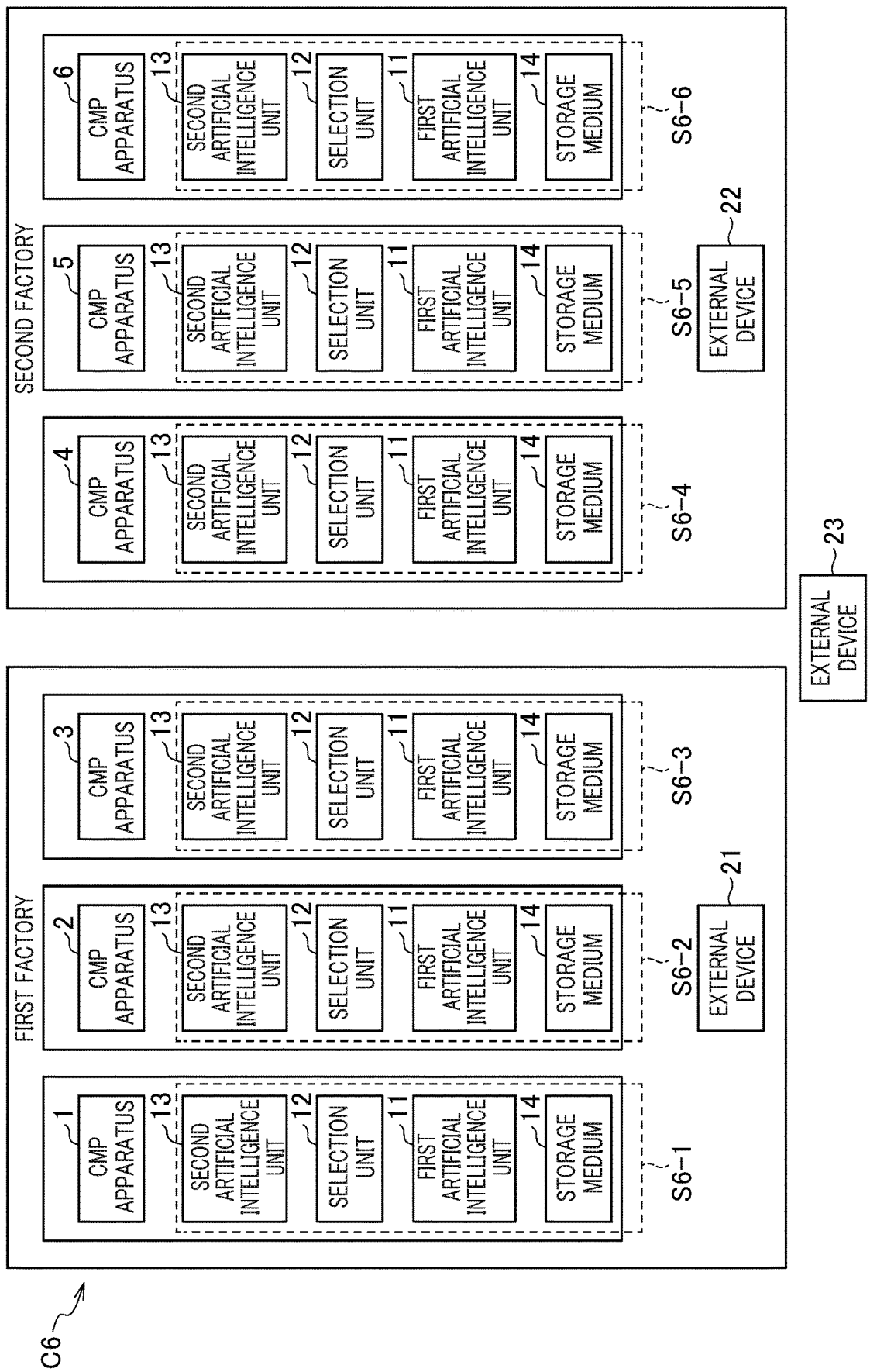
FIG. 10 is a diagram illustrating a schematic configuration of an example of a CMP system according to a sixth embodiment.

Next, a sixth embodiment will be described. FIG. 10 is a diagram illustrating a schematic configuration of an example of a CMP system according to the sixth embodiment. In the CMP system C1 of the first embodiment, as illustrated in FIG. 1, the first artificial intelligence unit 11, the selection unit 12, the second artificial intelligence unit 13, and the storage medium 14 are all provided in the analysis center. On the other hand, in a CMP system C6 of the sixth embodiment, as illustrated in FIG. 10, the first artificial intelligence unit 11, the selection unit 12, the second artificial intelligence unit 13, and the storage medium 14 are provided for each of the CMP apparatuses 1 to 6. As illustrated in FIG. 10, each of information processing systems S6-1 to S6-6 according to the sixth embodiment includes the first artificial intelligence unit 11, the selection unit 12, the second artificial intelligence unit 13, and the storage medium 14.

Seventh Embodiment

Figure 11:
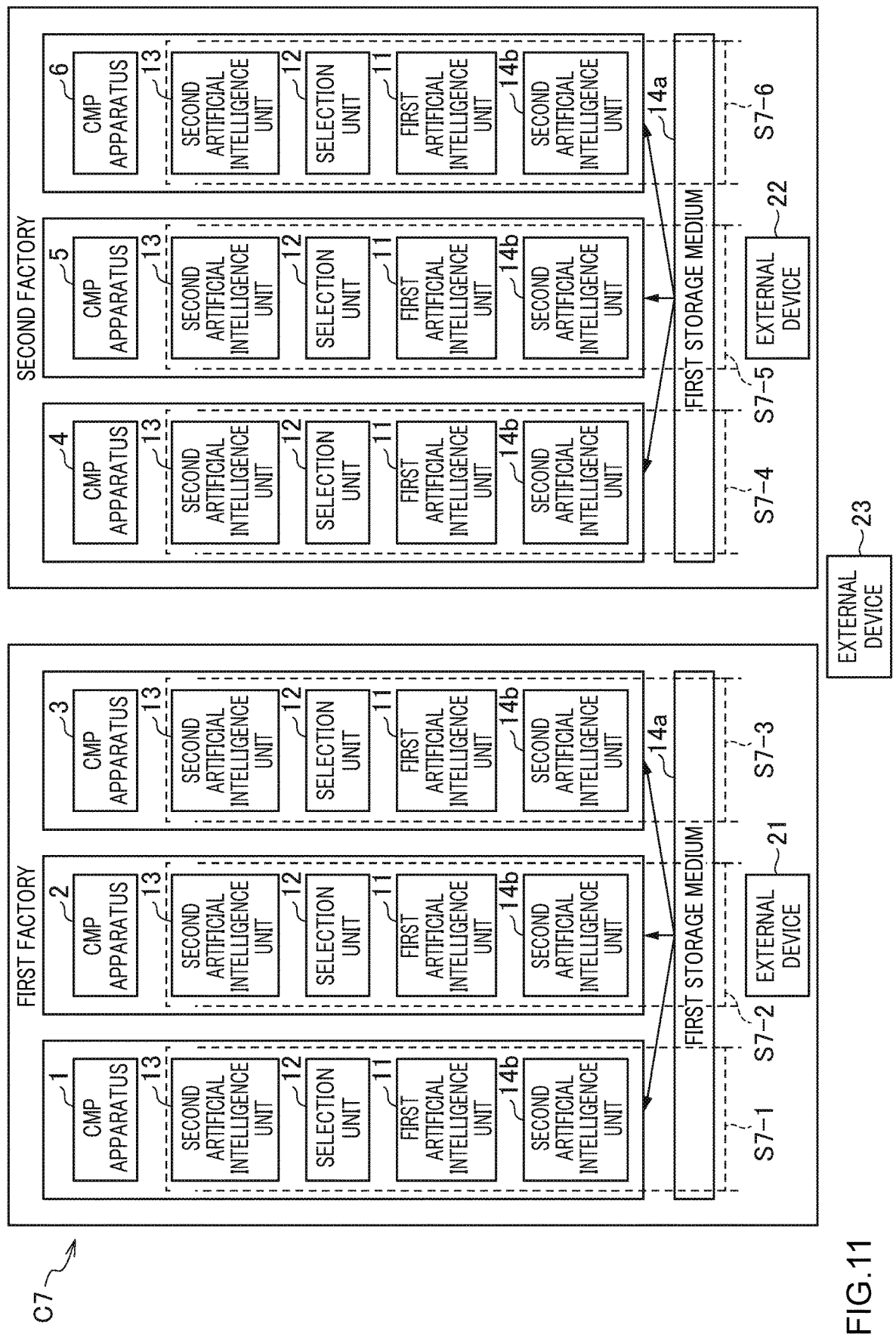
FIG. 11 is a diagram illustrating a schematic configuration of an example of a CMP system according to a seventh embodiment.

Next, a seventh embodiment will be described. FIG. 11 is a diagram illustrating a schematic configuration of an example of a CMP system according to the seventh embodiment. In the CMP system C1 of the first embodiment, as illustrated in FIG. 1, the first artificial intelligence unit 11, the selection unit 12, the second artificial intelligence unit 13, and the storage medium 14 are all provided in the analysis center. On the other hand, in a CMP system C7 of the seventh embodiment, as illustrated in FIG. 11, the first artificial intelligence unit 11, the selection unit 12, the second artificial intelligence unit 13, and a second storage medium 14b are provided in each of the CMP apparatuses 1 to 6, a first storage medium 14a is provided in each factory. The first storage medium 14a stores information outside the CMP apparatuses 1 to 6, and the second storage medium 14b stores information inside the corresponding CMP apparatus as well as information outside the CMP. As illustrated in FIG. 11, each of information processing systems S7-1 to S7-6 according to the seventh embodiment includes the first artificial intelligence unit 11, the selection unit 12, the second artificial intelligence unit 13, and a first storage medium 14a, and a second storage medium 14b.

In each embodiment, the substrate processing apparatus may include the second artificial intelligence unit 13 that has learned the relationship between a set of parameter values configured by a set of selected parameter types and performance values. Here, the learning is, for example, machine learning. In this case, the second artificial intelligence unit 13 predicts the performance value of the substrate processing apparatus when a variable parameter among the parameters configured by the selected set of the parameter types is changed, with, as an input, a fixed parameter intrinsically determined by the substrate processing apparatus among the parameters configured by the selected set of the parameter types, and outputs a combination of parameter values yielding a performance value, among the predicted performance values, satisfies the extraction criterion. In this case, the substrate processing apparatus processes the substrate with a combination of the output parameter values. With this configuration, the combination of the parameter values satisfying the extraction criterion is output using the learned second artificial intelligence unit 13, and the substrate is processed using the combination of the parameter values, so that the performance of the substrate processing apparatus can be improved.

Note that at least some of the information processing systems S1 to S7 described in the above-described embodiments may be configured by hardware or software. In the case of the hardware configuration, a program for implementing at least some functions of the information processing systems S1 to S7 may be stored in a computer-readable recording medium such as a flexible disk or a CD-ROM, and may be read and executed by a computer. The recording medium is not limited to a removable recording medium such as a magnetic disk or an optical disc, and may be a fixed recording medium such as a hard disk device or a memory.

In addition, a program for implementing at least some of the functions of the information processing systems S1 to S7 may be distributed via a communication line (including wireless communication) such as the Internet. Furthermore, the program may be distributed via a wired line or a wireless line such as the Internet or be being stored in a recording medium, in an encrypted, modulated, or compressed state.

Furthermore, the information processing systems S1 to S7 may be caused to function by one or a plurality of information processing apparatuses. In a case where a plurality of information processing apparatuses are used, one of the information processing apparatuses may be a computer, and the computer may execute a predetermined program to implement a function as at least one unit of the information processing systems S1 to S7.

In a method invention, all the processes (steps) may be implemented through automatic control by a computer. In addition, progress control between the processes may be performed manually, while a computer is caused to perform each of the processes. Furthermore, at least a part of all the processes may be performed manually.

As described above, the present invention is not limited to the above-described embodiments as they are, and can be embodied by modifying the components without departing from the gist of the present invention in the implementation stage. In addition, various inventions can be formed by combining a plurality of components disclosed in the above-described embodiments as appropriate. For example, some components may be deleted out of all the components illustrated in the embodiments. Furthermore, components in different embodiments may be combined as appropriate.

REFERENCE SIGNS LIST 1 to 6 CMP apparatus
11 First artificial intelligence unit
110 AI execution unit
111 AI
112 AI
113 AI
12 Selection unit
13 Second artificial intelligence unit
14 Storage medium
15 Determination unit
16 Exclusion criterion determination unit
21 to 23 External device
C1 to C7 CMP system
S1 to S3, S4-1, S4-2, S5-1, S5-2, S6-1 to S6-6, S7-1 to S7-6 Information processing system

The invention claimed is:

1. An information processing system that provides a combination of parameter values of a substrate processing apparatus, the system comprising:
at least one memory storing instructions; and
at least one processor that, upon executing the instructions, causes the system at least to:
collecting a plurality of first learning datasets from a plurality of substrate processing polishing apparatuses, each first learning dataset comprising sets of parameters used in the processing of substrates by the one or more substrate polishing apparatuses;
perform learning of the system using the plurality of first learning datasets as input values, wherein the parameters in the sets of parameters are different from each other in a combination of parameter types and output values of which are corresponding performance values of the substrate processing apparatus, wherein after the learning uses, as an input, each of a plurality of verification datasets including combinations of the parameter types that are same as the combinations of the parameter types at the time of learning, the system predicts a performance value;
select one set of parameter types from a plurality of sets of parameter types included in the plurality of verification datasets, by using at least one of a value indicating a percentage of correct answer of the predicted performance value, a time required for the learning, and a time required for predicting the performance value; and
perform learning using a plurality of second learning datasets as an input value, the plurality of second learning datasets comprising a set of past parameter values including the selected set of parameter types and an output value corresponding to a past performance value, wherein after the second learning, the system predicts performance values of a target substrate processing apparatus obtained by changing variable parameters among the parameters including the selected set of parameter types with, as an input, a fixed parameter intrinsically determined for a target substrate processing apparatus among parameters including the selected set of parameter types, and outputs to the target substrate processing apparatus, wherein the target substrate processing apparatus processes a wafer with a combination of parameter values, wherein the combination of parameter values yields a performance value, among the predicted performance values, satisfying an extraction criterion.

2. The information processing system according to claim 1, wherein the at least one processor upon executing the instructions, further causes the system at least to:
determine a correlation between each of a plurality of parameter values and performance values of the substrate processing apparatus, and uses a plurality of the determined correlations to determine parameter types of a plurality of parameters as the input values to the learning using the plurality of first learning datasets.

3. The information processing system according to claim 2, wherein the at least one processor upon executing the instructions, further causes the system at least to:
determine each mutual correlation between the plurality of parameter values of the substrate processing apparatus, and use the determined mutual correlation to add or partially or entirely replace the parameter types of the plurality of parameters as the input values to the learning using the plurality of second learning datasets.

4. The information processing system according to a claim 1, wherein the at least one processor upon executing the instructions, further causes the system at least to:
determine a formula of correlation between one parameter value and performance value of the substrate processing apparatus and use the formula of correlation to determine a criterion for excluding an abnormal value, wherein
select one set of parameter types from the plurality of sets of parameter types by excluding parameters satisfying the determined criterion.

5. The information processing system according to claim 1, wherein
the learning using the plurality of second learning datasets performs further learning with sets of a plurality of parameter value used by the target substrate processing apparatus and corresponding performance values added to the second learning datasets, or replaced with existing data included in the second learning datasets, and after the learning, predicts performance values of the substrate processing apparatus with, as an input, a plurality of verification datasets including parameters including the selected set of parameter types, and outputs a combination of parameter values yielding a performance value, among the predicted performance values, satisfying the extraction criterion.

6. A non-transitory computer-readable storage medium storing a program causing a computer used in the information processing system according to claim 1 to perform the learning using a plurality of first learning datasets.

7. A non-transitory computer-readable storage medium storing a program causing a computer used in the information processing system according to claim 1 to perform the learning using a plurality of second learning datasets.

8. A substrate processing apparatus comprising:
at least one memory storing instructions including an artificial intelligence unit that has learned a relationship, learned by the information processing system of claim 1; and
at least one processor upon executing the instructions, causes the system at least to:
predict, based on performance values of the substrate processing apparatus obtained by changing variable parameters among the parameters including the selected set of parameter types with as an input to the artificial intelligence unit, a fixed parameter intrinsically determined for the substrate processing apparatus among the parameters including the selected set of parameter types, and
processing a wafer with the combination of parameter values, a combination of parameter values yielding a performance value, among the predicted performance values, satisfying an extraction criterion.

9. An information processing method of providing a combination of parameter values of a substrate processing apparatus, the method comprising:
collecting a plurality of first learning datasets from a plurality of substrate processing polishing apparatuses, each first learning dataset comprising sets of parameters used in the processing of substrates by one or more substrate polishing apparatuses;
perform learning of the system using the plurality of first learning datasets as input values, wherein the parameters in the sets of parameters differ from each other in a combination of parameter types and output values of which are corresponding performance values of the substrate processing apparatus, wherein after the learning, predicting a performance value with, as an input, each of a plurality of verification datasets including combinations of the parameter types that are common to the combinations of the parameter types at the time of learning; and selecting one set of parameter types from a plurality of sets of parameter types included in the plurality of verification datasets, by using at least one of a value indicating a percentage of correct answer of the predicted performance value, a time required for the learning, and a time required for predicting the performance value; and performing learning using a plurality of second learning datasets as an input value, the plurality of second learning datasets comprising a set of past parameter values including the selected set of parameter types and an output value corresponding past performance value, wherein after the second learning, the system predicting performance values of a target substrate processing apparatus with, as an input, a plurality of verification datasets including parameters including the selected set of parameter types, and outputting to the target substrate processing apparatus, wherein the target substrate processing apparatus processes a wafer with the combination of parameter values, wherein the combination of parameter values yields a performance value, among the predicted performance values, satisfying an extraction criterion.

* * * * *